United States Patent
Naito et al.

(10) Patent No.: US 7,491,902 B2
(45) Date of Patent: Feb. 17, 2009

(54) ELECTROMAGNETIC WAVE SHIELDING FILM AND METHOD FOR PRODUCING THE SAME

(75) Inventors: Nobuo Naito, Tokyo-To (JP); Fumihiro Arakawa, Tokyo-To (JP); Tadahiro Masaki, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 147 days.

(21) Appl. No.: 10/580,414

(22) PCT Filed: Jan. 20, 2005

(86) PCT No.: PCT/JP2005/000644

§ 371 (c)(1),
(2), (4) Date: May 23, 2006

(87) PCT Pub. No.: WO2005/072040

PCT Pub. Date: Aug. 4, 2005

(65) Prior Publication Data

US 2007/0181326 A1 Aug. 9, 2007

(30) Foreign Application Priority Data

Jan. 21, 2004 (JP) ............................. 2004-012526

(51) Int. Cl.
*H05K 9/00* (2006.01)
(52) U.S. Cl. .......................... 174/389; 174/392; 313/313
(58) Field of Classification Search ................. 174/389, 174/392, 394; 313/313, 479
See application file for complete search history.

(56) References Cited

U.S. PATENT DOCUMENTS

| | | | |
|---|---|---|---|
| 2003/0007341 A1 | 1/2003 | Shimamura et al. | |
| 2003/0094296 A1 | 5/2003 | Kojima et al. | |
| 2003/0164243 A1 | 9/2003 | Arakawa et al. | |
| 2004/0170857 A1* | 9/2004 | Yoshihara et al. | 428/553 |

FOREIGN PATENT DOCUMENTS

| | | |
|---|---|---|
| JP | A-2000-013088 | 1/2000 |
| JP | A-2000-059079 | 2/2000 |
| JP | A-2002-009484 | 1/2002 |
| JP | A-2002-347166 | 12/2002 |
| JP | A-2003-037388 | 2/2003 |
| JP | A-2003-086991 | 3/2003 |
| JP | A-2003-258488 | 9/2003 |
| JP | A-2003-318596 | 11/2003 |

* cited by examiner

*Primary Examiner*—Hung V Ngo
(74) *Attorney, Agent, or Firm*—Oliff & Berridge, PLC

(57) ABSTRACT

An electromagnetic wave shielding sheet 1 comprises a transparent substrate 11, and a first anticorrosive layer 23A, a first blackening layer 25A, a metal layer 21, and a second anticorrosive layer 23B that are successively formed on the transparent substrate 11 through an adhesive layer 13. A second blackening layer 25B is formed so that it fully covers the side faces of the first anticorrosive layer 23A, the first blackening layer 25A, the metal layer 21, and the second anticorrosive layer 23B, as well as the front face of the second anticorrosive layer 23B. At least either of the first anticorrosive layer 23A and the second anticorrosive layer 23B contains one or more metals selected from nickel, chromium, and silicon, and also zinc and/or tin when it is initially formed, and the zinc and/or tin is removed from the first anticorrosive layer 23A and/or the second anticorrosive layer 23B in an intermediate steps.

7 Claims, 3 Drawing Sheets

ELECTROMAGNETIC WAVE SHIELDING FILM AND METHOD FOR PRODUCING THE SAME

FIELD OF THE INVENTION

The present invention relates to an electromagnetic wave shielding sheet for preventing EMI (electromagnetic (wave) interference) that is caused by electromagnetic waves generated by such displays as cathode ray tubes (hereinafter also referred to as CRTs) and plasma display panels (hereinafter also referred to as PDPs), and, more particularly, to an electromagnetic wave shielding sheet that does not impair the visibility of an image displayed on a display and that can be produced in a small number of steps, and to a method for producing the electromagnetic wave shielding sheet.

In this Specification, "ratio", "part", "%", and the like that indicate proportions are on a weight basis unless otherwise specified, and the symbol "/" denotes that layers enumerated together with this symbol are integrally laminated. "EMI", "NIR", and "PET" designate "electromagnetic (wave) interference", "near infrared rays", and "polyethylene terephthalate", respectively, and are abbreviations, synonyms, functional expressions, common designations, or terms used in the art.

BACKGROUND ART

1. Background Art

Electromagnetic interference has increased in recent years due to advances in the performance of electrical and electronic equipment and also to the growing use of the same. Even such displays as CRTs and PDPs generate electromagnetic waves. A PDP is an assembly composed of a glass substrate having a data electrode and a fluorescent layer, and a glass substrate having a transparent electrode. When operated, such a display not only emits visible light from which an image on the display is produced, but also generates electromagnetic waves, near infrared rays, and heat in large amounts. In general, a front panel containing an electromagnetic wave shielding sheet is mounted on the front of a PDP in order to shield the electromagnetic waves that the PDP generates. Such a front panel is required to have an efficiency of 30 dB or more in shielding electromagnetic waves with frequencies of 30 MHz to 1 GHz that are emitted from the front of the display. The front panel is also required to shield near infrared rays with wavelengths of 800 to 1,100 nm emitted from the front of the display because these rays cause malfunction of other equipment such as VTRs.

Further, in order to keep an image displayed on the display highly visible, the electromagnetic wave shielding material is required to be less visible (non-recognizability being high) and to have, as a whole, moderate transparency (visible light transmission).

Furthermore, PDPs are characterized by having large-sized screens, and electromagnetic wave shielding sheets for such PDPs are large in size (external dimension); their sizes are as large as 621×831 mm for 37-inch displays and 983×583 mm for 42-inch displays, for example, and still larger sizes exist. This fact demands a production method that is convenient to handle large-sized materials. In sum, the electromagnetic wave shielding sheets are required to have electromagnetic wave shielding properties and to be made from less visible electromagnetic wave shielding materials having moderate transparency so as not to impair the visibility of images displayed, and there is a demand for a production method by which an electromagnetic wave shielding sheet can be produced in a small number of steps with high productivity.

2. Related Art

To produce electromagnetic wave shielding sheets containing metal mesh layers, the following two methods have usually been employed.

One of the known methods is that electrically conductive ink or a photosensitive coating liquid containing a catalyst for chemical plating is applied to the entire surface of a transparent substrate, and the coating is photolithographically made into a mesh, which is then plated with a metal (see Patent Documents 1 and 2, for example). However, this method is disadvantageous in that, since the metal layer face on the transparent substrate side cannot be blackened, it is impossible to avoid lowering of image visibility that is caused by extraneous light such as sunlight that is incident on and is reflected from the metal mesh. Further, in the production process, if electrically conductive ink is used, it takes a longer time for plating because the electrical resistance of the electrically conductive ink is high, and productivity is therefore low. Besides, this method has been disadvantageous also in that the metal mesh is oxidized in the air and undergoes change of properties to have an increased electrical resistance, which results in deterioration of electromagnetic wave shielding properties.

Another known method is as follows: a copper mesh layer with line parts that define multiple openings is laminated to a PET film (transparent substrate) with an adhesive layer; and all of the surfaces, back surfaces, and side faces of the line parts of the copper mesh layer are subjected to blackening treatment (see Patent Document 3, for example). However, the blackening treatment is chemical conversion treatment, and needle crystals are formed, so that the blackening layer thus formed readily falls off or is deformed. Moreover, since the treatment is conducted at a high temperature, the laminate tends to be curled and its appearance is adversely affected.

Patent Document 1: Japanese Patent Laid-Open Publication No. 13088/2000,

Patent Document 2: Japanese Patent Laid-Open Publication No. 59079/2000, and

Patent Document 3: Japanese Patent Laid-Open Publication No. 9484/2002.

SUMMARY OF THE INVENTION

The present invention was accomplished in order to solve the above-described problems in the prior art. An object of the present invention is, therefore, to provide an electromagnetic wave shielding sheet that has moderate transparency, that is excellent in electromagnetic wave shielding properties, non-recognizability of its mesh, and appearance, that does not undergo deterioration of electromagnetic wave shielding properties by metal oxidization, and that does not impair the visibility of an image displayed on a display, and a production method by which the electromagnetic wave shielding sheet can be produced in a small number of steps.

The present invention is an electromagnetic wave shielding sheet comprising a transparent substrate, and a metal mesh layer laminated to one surface of the transparent substrate with an adhesive layer, a first blackening layer containing copper being formed on one face of the metal mesh layer on the side of the transparent substrate, and a second anticorrosive layer containing one or more metals selected from chromium, nickel, and silicon being formed on the other face of the metal mesh layer on the side opposite to the transparent substrate.

The present invention is the electromagnetic wave shielding sheet further comprising, a first anticorrosive layer containing one or more metals selected from chromium, nickel, and silicon being formed between the first blackening layer and the transparent substrate.

The present invention is the electromagnetic wave shielding sheet in which the side faces of the first blackening layer, the metal layer, and the second anticorrosive layer that are on the transparent substrate, and the front face of the second anticorrosive layer are fully covered with a second blackening layer.

The present invention is the electromagnetic wave shielding sheet in which the side faces of the first anticorrosive layer, the first blackening layer, the metal layer, and the second anticorrosive layer that are on the transparent substrate, and the front face of the second anticorrosive layer are fully covered with a second blackening layer.

The present invention is the electromagnetic wave shielding sheet in which the second blackening layer is formed by plating, and comprises at least one metal selected from copper, cobalt, nickel, zinc, molybdenum, tin, and chromium, or a compound of any of these metals, or an alloy consisting of two or more of these metals.

The present invention is a method for producing an electromagnetic wave shielding sheet, comprising the steps of preparing a metal layer, successively forming a first blackening layer and a first anticorrosive layer on the face of the metal layer on the side of a transparent substrate, forming a second anticorrosive layer on the other face of the metal layer on the side opposite to the transparent substrate, laminating the metal layer and the transparent substrate with an adhesive layer, with the anticorrosive layer facing the transparent substrate, to form a laminate, and etching the laminate to make the metal layer into a mesh.

The present invention is the method for producing an electromagnetic wave shielding sheet, in which at least either of the first anticorrosive layer and the second anticorrosive layer contains one or more metals selected from nickel, chromium, and silicon, and also zinc and/or tin when it is initially formed, and the zinc and/or tin is removed from the first anticorrosive layer and/or the second anticorrosive layer in the step of etching.

The present invention is the method for producing an electromagnetic wave shielding sheet, in which, after the step of etching, the side faces of the first anticorrosive layer, the first blackening layer, the metal layer, and the second anticorrosive layer that are in the laminate, and the front face of the second anticorrosive layer are fully covered with a second blackening layer.

The present invention provides an electromagnetic wave shielding sheet that has moderate transparency, that is excellent in electromagnetic wave shielding properties and non-recognizability of its mesh, that does not impair the visibility of an image displayed on a display, and that does not undergo deterioration of electromagnetic wave shielding properties by the oxidation of a metal layer.

The present invention provides an electromagnetic wave shielding sheet that has moderate transparency and excellent electromagnetic wave shielding properties, and that can more surely prevent reflection of light from a mesh especially in a bright environment to make the mesh more unrecognizable and thus not to impair the visibility of an image displayed on a display.

The present invention provides a method for producing an electromagnetic wave shielding sheet in which an anticorrosive layer can be formed with ease and by which a highly durable electromagnetic wave shielding sheet can be produced.

BEST MODE FOR CARRYING OUT THE INVENTION (Basic Matters)

Figure 1:
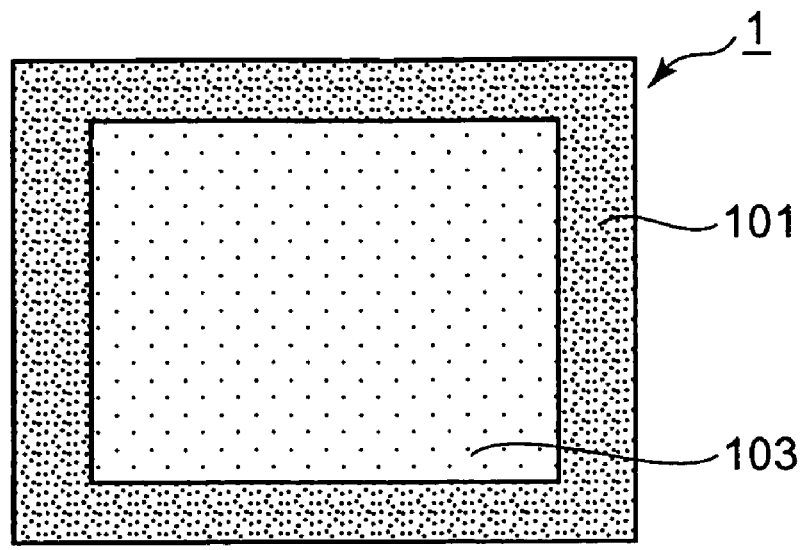
FIG. 1 is a plane view of an electromagnetic wave shielding sheet according to the present invention.
Figure 2:
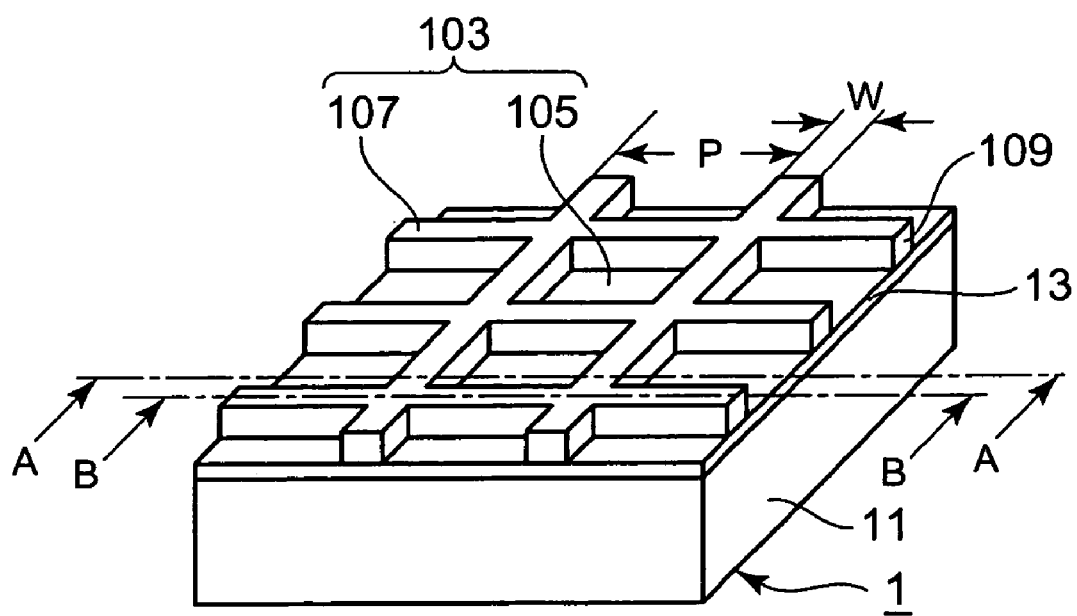
FIG. 2 is a perspective view showing the mesh part shown in FIG. 1.

Embodiments of the present invention will be described hereinafter with reference to the accompanying drawings. As shown in FIGS. 1 and 2, an electromagnetic wave shielding sheet 1 includes essentially a mesh part 103, and optionally, around the mesh part 103, a frame part 101 for grounding. As shown in FIG. 3(A), a sectional view, the electromagnetic wave shielding sheet 1 comprises a transparent substrate 11, and a metal mesh layer 21 laminated to one face of the transparent substrate 11 with a transparent adhesive layer 13. On face of the metal mesh layer 21 on the side of the transparent substrate 11, a first blackening layer 25A is formed as shown in FIG. 3(A). In some other figures, while a second anticorrosive layer 23B is formed on the other face of the metal mesh layer 21 on the side opposite to the transparent substrate 11. Alternatively, a first blackening layer 25A and a first anticorrosive layer 23A may be successively formed on the face of the metal mesh layer 21 on the side of the transparent substrate 11, as shown in FIG. 3(B).

In FIGS. 1 and 2, the mesh part 103 is composed of line parts 107 that define a plurality of openings 105. The line parts 107 have the metal layer 21, the first blackening layer 25A, and the optional first anticorrosive layer 23A that are on the face of the metal layer 21 on the side of the transparent substrate 11, and the second anticorrosive layer 23 on the other face of the metal layer 21 on the side opposite to the transparent substrate 11. FIGS. 3(A) and 3(B) and FIGS. 4(A) and 4(B) are sectional views taken along line A-A of FIG. 2, in which the line parts 107 are formed along line B-B of FIG. 2.

Further, as shown in FIG. 4(A), a second blackening layer 25B may be formed to cover the front face (surface) and the side faces of the [first blackening layer 25A/metal layer 21/first anticorrosive layer 23A] in the form of a mesh.

As shown in FIG. 4(B), a second blackening layer 25B may be formed to cover the front face (surface) and the side faces of the [first anticorrosive layer 23A/first blackening layer 25A/metal layer 21/second anticorrosive layer 23B] in the form of a mesh.

The above-described [first blackening layer 25A/metal layer 21/second anticorrosive layer 23B], [first anticorrosive layer 23A/first blackening layer 25A/metal layer 21 second anticorrosive layer 23B], [first blackening layer 25A/metal layer 21/first anticorrosive layer 23A/second blackening layer 25B], and [first anticorrosive layer 23A/first blackening layer 25A/metal layer 21/second anticorrosive layer 23B/second blackening layer 25B ] are electromagnetic wave shielding layers, and each electromagnetic wave shielding layer includes the mesh part 103 that serves as an image-displaying part, and optionally the frame part 101.

(Method)

In the production of the electromagnetic wave shielding sheet according to the present invention, the first anticorrosive layer 23A and the second anticorrosive layer 23B are made to contain one or more metals selected from chromium, nickel, and silicon (or all of these metals) when they are formed. Alternatively, these layers may be made to contain, in addition to these metals, zinc and/or tin when they are initially formed; and the zinc and/or tin is removed in the intermediate step so that the layers finally contain the one or more metals selected from chromium, nickel, and silicon. The other steps may be effected in conventional manners.

For example, a method for producing the [transparent substrate 11/adhesiveadhesive layer 13/first anticorrosive layer 23A/first blackening layer 25A/metal layer 21/second anticorrosive layer 23B/second blackening layer 25B], that is a laminate including the greatest number of constituent layers, comprises the steps of (1) preparing a metal layer, (2) forming a first blackening layer on one face of the metal layer, and first and second anticorrosive layers on both sides of the metal layer, (3) laminating the metal layer and a transparent substrate with an adhesive, with the first anticorrosive layer facing the transparent substrate, (4) photolithographically making, into a mesh pattern, the first anticorrosive layer, the first blackening layer, the metal layer, and the second anticorrosive layer that have been formed on the transparent substrate, and (5) subjecting the mesh pattern to blackening treatment to form a second blackening layer.

(Metal Layer)

A metal having electrical conductivity good enough to satisfactorily shield electromagnetic waves, such as gold, silver, copper, iron, nickel, or chromium, may be used for the metal layer 21. Of these metals, iron and copper are preferred because they have high electrical conductivity (and also high magnetic permeability) that contributes to the exhibition of electromagnetic wave shielding properties, show excellent processability in etching, and are relatively inexpensive. Copper is preferred when high electrical conductivity is particularly required, and iron is preferred when high magnetic permeability or hysteresis loss is required in addition to electrical conductivity. The metal layer may be not only a layer of a single metal but also an alloy layer or a multi-layered one. Low-carbon steels such as low-carbon rimmed steels and low-carbon aluminum killed steels, Ni—Fe alloys, and invar alloys are herein preferred as iron materials. If cathodic electrodeposition is conducted as blackening treatment, it is preferable to use copper or copper alloy foil as the metal layer because it is easy to electrodeposit a blackening layer on such a material. Although both rolled copper foil and electrolytic copper foil can be used as the copper foil, electrolytic copper foil is preferred because of its uniformity in thickness and of adhesion to a layer formed by blackening treatment and/or chromate treatment and because it can have a thickness as small as below 10 µm. The thickness of the metal layer 21 is approximately from 1 to 100 µm, and preferably from 5 to 20 µm. If the metal layer 21 has a thickness smaller than the above range, although it can be photolithographically processed into a mesh with ease, it has an increased electrical resistance value and thus shows impaired electromagnetic wave shielding effect. When the metal layer 21 has a thickness in excess of the above range, it cannot be made into the desired fine mesh. Consequently, the mesh has a decreased substantial opening rate and a decreased light transmittance, resulting in a narrower viewing angle and lower image visibility.

The surface roughness of the metal layer 21 is approximately 0.1 to 10 µm, preferably 0.5 to 10 µm, as indicated by the Rz value. If the metal layer 21 has a surface roughness lower than this range, it specularly reflects extraneous light even if it is subjected to blacking treatment, and thus makes image visibility lower. If the surface roughness of the metal layer 21 is greater than the above range, an adhesive or resist, upon application thereof, does not spread over the entire surface of the metal layer, or involves air to produce air bubbles. The surface roughness Rz is herein a mean value of 10 measurements obtained in accordance with JIS-B0601 (1994 version).

(First Blackening Layer)

Blackening treatment for forming the first blackening layer 25A (to form a blackening layer is hereinafter referred to as blackening treatment) is conducted when the metal layer 21 is still in the state of a single layer. The blackening treatment may be carried out by roughening or blackening the surface of the metal layer, and the deposition of a metal, an alloy, a metal oxide, or a metal sulfide, or a variety of other techniques may be used for this treatment. Preferred methods for conducting the blackening treatment include plating, and plating makes it possible to form a blackening layer on the metal layer 21 with good adhesion and to uniformly blacken the surface of the metal layer 21 with ease. As for materials for plating, when copper is used for the metal layer, a material containing copper is preferred from the viewpoint of adhesion to the metal layer. Specifically, copper itself, a compound containing copper, or an alloy containing copper is used. For example, there may be used copper oxide, copper sulfide, or an alloy or compound containing copper as an essential component and at least one metal selected from cobalt, nickel, zinc, molybdenum, tin, and chromium. When such a metal containing copper is made into the first blackening layer 25A, excellent adhesion can be obtained between the first blackening layer 25A and the metal layer 21, especially a copper layer. When other metals or compounds are used, the metal layer 21 cannot be fully blackened, or the adhesion of the blackening layer to the metal layer 21 is insufficient. These troubles occur significantly in the case where cadmium is used for plating, for example.

When copper itself is used, since fine particles of copper are deposited on the metal layer, reflected light is diffused or partly absorbed by the fine particles to decrease the amount of the reflected light per direction, whereby the metal layer is blackened. In this case, the surface roughness of the layer of the copper fine particles is preferably about 0.1 to 3 µm, as indicated by the Rz value.

A plating process that is preferably employed when copper foil is used as the metal layer 21 is cathodic electrodeposition plating in which copper foil is subjected to cathodic electrolysis in an electrolyte such as sulfuric acid, copper sulfate, or cobalt sulfate, thereby depositing cationic particles on the copper foil. The cationic particles deposited roughen the copper foil and, at the same time, make the copper foil black in color. Although the cationic particles may be either copper particles or particles of an alloy of copper and another metal, copper-cobalt alloy particles are herein preferred. The mean particle diameter of the copper-cobalt alloy particles is preferably from 0.1 to 1 µm.

Cathodic electrodeposition is convenient to deposit uniformly sized particles with a mean particle diameter of 0.1 to 1 µm. Further, if treated at high current density, the surface of copper foil becomes cathodic and generates reducing hydrogen to get activated, so that significantly improved adhesion can be obtained between the copper foil and the particles. In the case where the mean particle diameter of the copper-cobalt alloy particles is outside the above-described range, if the mean particle diameter of the copper-cobalt alloy particles is greater than the above range, the blackness of the copper foil is insufficient, and, moreover, the falling of the particles (also referred to as the falling of the powdery coating) easily occurs. In addition, the external appearance of the agglomerated particles becomes poor in denseness, and the non-uniformity of appearance and that of light absorption become noticeable. Copper-cobalt alloy particles with a mean particle diameter smaller than the above-described range are also insufficient in blackening ability and cannot fully prevent reflection of extraneous light to make image visibility lower.

(First and Second Anticorrosive Layers)

Thereafter, a first anticorrosive layer 23A is formed on the one face of the blackening layer 25A on the metal layer 21, and a second anticorrosive layer 23B, on the other face of the metal layer 21. The first and the second anticorrosive layers 23A, 23B may be formed on both sides of the metal layer 21 either simultaneously or successively. The first anticorrosive layer 23A and the second anticorrosive layer 23B have the function of protecting the surface of the first blackening layer 25A and that of the metal layer 21 from corrosion, respectively, and, in addition, when particles are used for the blackening treatment, these layers can prevent falling or deformation of the particles. In order to prevent falling or deformation of the particles with which the first blackening layer 25A is formed, it is essential to provide the first anticorrosive layer 23A. Although conventional anticorrosive layers can be used as the first anticorrosive layer 23A and/or the second anticorrosive layer 23B, one or more metals selected from nickel, chromium, and silicon are herein used as materials for these anticorrosive layers. For example, chromium, nickel, chromium+nickel, chromium+nickel+silicon, and oxides of these metals are preferred, and a material containing chromium, nickel, and silicon is particularly preferred. The thickness of each anticorrosive layer is approximately 0.001 to 1 μm, preferably from 0.001 to 0.1 μm.

Chromium, nickel, chromium+nickel, chromium+nickel+silicon, or an oxide of any of these metals is deposited by a conventional plating process to form an anticorrosive layer, and, in the present invention, it is preferable to initially form a layer that contains zinc and/or tin in addition to one or more metals selected from nickel, chromium, and silicon.

In the case where the first anticorrosive layer 23A and the second anticorrosive layer 23B contain nickel, since the nickel is brought to the passive state, these layers show remarkably improved corrosion resistance and can more surely prevent falling of the blackening layer.

To incorporate silicon in the first anticorrosive layer 23A and/or the second anticorrosive layer 23B, a silicon-containing compound, preferably such a silicon-containing compound as a silane-coupling agent, may be added to a plating bath. Since the first anticorrosive layer 23A and/or the second anticorrosive layer 23B that contain silicon shows significantly improved corrosion resistance, such a layer remains even after the step of stripping a resist with an alkaline solution that is effected after a photolithographic process, which will be described later.

(Transparent Substrate)

A variety of materials having transparency, insulating properties, heat resistance, mechanical strength, etc. good enough to withstand the service and production conditions can be used for the transparent substrate 11. Examples of materials useful herein include glass and transparent resins. Glass includes silica glass, borosilicate glass, and soda-lime glass, and it is preferable to use non-alkali glass which contains no alkali components and which has a low rate of thermal expansion and is excellent in dimensional stability and also in working properties in high-temperature heat treatment. A non-alkali glass substrate may be made to serve also as a substrate for an electrode.

Examples of transparent resins herein useful include polyester resins such as polyethylene terephthalate, polybutylene terephthalate, polyethylene naphthalate, terephthalic acid-isophthalic acid-ethylene glycol copolymers, and terephthalic acid-cyclohexane dimethanol-ethylene glycol copolymers; polyamide resins such as nylon 6; polyolefin resins such as polypropylene and polymethyl pentene; acrylic resins such as polymethyl methacrylate; styrene resins such as polystyrene and styrene-acrylonitrile copolymers; cellulose resins such as triacetyl cellulose; imide resins; and polycarbonate. A sheet, film, plate or the like of any of these resins can be used as the transparent substrate.

The transparent substrate that is a film, plate, or the like of the transparent resin may be made from a copolymer resin or mixture (including an alloy) containing, as a main component, any of the above-enumerated resins, or may also be a laminate of two or more layers. Although such a transparent substrate may be either an oriented or non-oriented film, a mono- or bi-axially oriented film is preferably used in order to obtain increased strength. Generally, the thickness of the transparent substrate is approximately 12 to 1000 μm; however, the preferred thickness is from 50 to 700 μm, and the optimum thickness is from 100 to 500 μm, when a transparent resin is used for the transparent substrate. When glass is used for the transparent substrate, the preferred thickness is approximately 1000 to 5000 μm. In either case, a transparent substrate with a thickness smaller than the above range cannot have sufficiently high mechanical strength, so that it curls, becomes wavy, or is broken; while a transparent substrate with a thickness greater than the above range has excessively high strength, which is wasteful from the viewpoint of cost.

In general, a film of a polyester resin such as polyethylene terephthalate or polyethylene naphthalate, a cellulose resin film, or a glass plate is conveniently used as the transparent substrate because it is excellent in both transparency and heat resistance and is also inexpensive. Of these materials, a polyethylene terephthalate film is most preferred because it is hard to break, is light in weight, and is easy to form. A transparent substrate having higher transparency is better, and the preferred transparency, as indicated by the transmittance for visible light, is 80% or more.

Prior to the application of an adhesive, the transparent substrate film face to be coated with the adhesive is subjected to adhesion-improving treatment such as corona discharge treatment, plasma treatment, ozone treatment, flame treatment, primer (also referred to as anchoring, adhesion-promoting or adhesion-improving agent) coating treatment, preheating treatment, dust-removing treatment, vacuum deposition, or alkali treatment. Additives such as ultraviolet light absorbers, fillers, plasticizers, and antistatic agents may be incorporated in the resin film, as needed.

(Method of Lamination)

The transparent substrate 11 and the above-described first anticorrosive layer 23A or first blackening layer 25A that is on the metal layer 21 are laminated with an adhesive 13 to form a laminate 1a. This lamination process is as follows: an adhesive resin, or a mixture of adhesive resins, is made into a fluid such as a latex, an aqueous dispersion, or an organic solvent solution, which is then printed on or applied to the surface of the transparent substrate 11, or to the surface of the first anticorrosive layer 23A or of the first blackening layer 25A, or to these two surfaces by a conventional printing or coating method such as screen printing, gravure printing, comma coating, or roll coating, and is dried, if necessary. Then the opposite material is superposed on the adhesive layer, and pressure is exerted; and the adhesive is then hardened. The thickness of the adhesive layer (when dried) is approximately from 0.1 to 20 μm, preferably from 1 to 10 μm.

Specifically, the metal layer 21 and the transparent substrate 11 that are in continuous belt-shaped (rolled-up) forms are usually used in the lamination process. Namely, the adhesive is applied to the metal layer and/or the substrate film in the state of being unrolled from a wind-up roll and stretched, and is then dried; the other material is superposed on this adhesive layer, and pressure is exerted. This one is further subjected to aging (aging and hardening) in an atmosphere at 30 to 80° C. for several hours to several days, as needed, thereby obtaining a rolled laminate. It is preferable to use a method that is called dry laminating by those skilled in the art.

(Dry Laminating)

Dry laminating is a method of laminating two types of materials in the following manner: by such a coating method as roll, reverse roll, or gravure coating, an adhesive dispersed or dissolved in a solvent is applied to one of the two materials so that the dried layer has a thickness of approximately 0.1 to 20 μm, preferably 1 to 10 μm, and the solvent is evaporated to form an adhesive layer; immediately after forming the adhesive layer, the other laminating material is superposed on the adhesive layer; and this laminate is aged at 30 to 80° C. for several hours to several days to harden the adhesive. The adhesive that can be used in the dry laminating includes adhesives made from thermosetting resins. Specific examples of thermosetting resin adhesives useful herein include two-part curing urethane adhesives that can be obtained by the reaction of polyfunctional isocyanates such as tolylene diisocyanate or hexamethylene diisocyanate with hydroxyl-group-containing compounds such as polyether polyols or polyacrylate polyols; acrylic adhesives; and rubber adhesives. Of these, two-part curing urethane adhesives are preferred.

Alternatively, there may be used a method in which an ionizing radiation curing resin is used as the adhesive in place of the thermosetting resin, and ionizing radiation is applied to cure the resin. In this case, ultraviolet light or an electron beam is usually used as the ionizing radiation.

The [first blackening layer 25A/metal layer 21/second anticorrosive layer 23B] in the laminate 1a of the [transparent substrate 11/adhesiveadhesive layer/first blackening layer 25A/metal layer 21/second anticorrosive layer 23B], or the [first anticorrosive layer23A/first blackening layer 25A/metal layer 21/second anticorrosive layer 23B] in the laminate 1a of the [transparent substrate 11/adhesiveadhesive layer/first anticorrosive layer 23A/first blackening layer 25A/metal layer 21/second anticorrosive layer 23B] is photolithographically made into a mesh pattern.

(Photolithographic Process)

A mesh-patterned resist layer is formed on the surface of the second anticorrosive layer 23B in the above-described laminate 1a; those portions of the metal layer 21 that are not covered with the resist layer are removed by etching; and the resist layer is then stripped, thereby obtaining an electromagnetic wave shielding layer in a mesh pattern. As shown in FIG. 1, the electromagnetic wave shielding layer consists of a mesh part 103 and an optional frame part 101. Further, as shown in FIG. 2, the mesh part 103 has line parts 107, the remaining portions of the metal layer 21, by which openings 105 are defined; while the frame 101 has no openings 105 and is wholly the remaining metal layer 21. The frame 101 is optional and may be provided so that it surrounds the mesh part 103 or covers at least a part of the area around the mesh part 103.

The above-described process is for processing the belt-shaped laminate 1a in the form of a continuously wound-up roll. While unwinding and carrying the laminate 1a either continuously or intermittently, masking, etching, and resist stripping are conducted, with the laminate stretched and non-loosened. First, masking is conducted in the following manner: a photosensitive resist, for example, is applied to the metal layer 21 and is dried; this resist is subjected to contact exposure, using an original plate with a predetermined pattern (consisting of the line parts of the mesh part and the frame part); thereafter, development with water, film-hardening treatment, and baking are conducted. The application of the resist is conducted in the following manner: while continuously or intermittently unwinding and carrying the belt-shaped, wound-up laminate, a resist made from casein, PVA, or gelatin is applied to the side of the metal layer 21 of the laminate by such a method as dipping (immersion), curtain coating, or flow coating. Alternatively, a dry film resist may be used as the resist; the use of a dry film resist can improve working efficiency. When casein is used as the resist, baking is usually conducted by heating, and, in this case, it is preferable to make the heating temperature as low as possible in order to prevent the laminate from curling.

(Etching)

Etching is conducted after masking. Since etching is conducted continuously, it is preferable to use, as an etchant, a ferric or cupric chloride solution that can be readily circulated. Further, it is possible to effect this etching step by the use of facilities for the production of a shadow mask for a cathode ray tube of color TV, in which belt-shaped continuous steel stock, especially a thin plate with a thickness of 20-80 μm, is etched. Namely, it is possible to use the existing facilities for the production of the shadow mask and to continuously effect a series of the steps of from masking to etching, so that the production efficiency is extremely high. After etching, the laminate is subjected to washing with water, stripping of the resist with an alkaline solution, and cleaning, and is then dried.

With the alkaline solution used for resist stripping, the tin or zinc is eluted from the second anticorrosive layer 23B that is exposed to the surface. To remove the tin or zinc from the first anticorrosive layer 23A and the second anticorrosive layer 23B that are on the two faces of the laminate, the first anticorrosive layer 23A formed on the metal layer 21 is subjected to alkali treatment before it is laminated to the transparent substrate 11, thereby removing the tin or zinc both from the first anticorrosive layer 23A beforehand. It is therefore not necessary to provide the step of removing the tin or zinc from the first anticorrosive layer 23A and from the second anticorrosive layer 23B, and thus the number of the steps does not increase, as a whole.

(Mesh)

The mesh part 103 is an area surrounded by the frame part 101. The mesh part 103 has line parts 107 that define a plurality of openings 105. The openings 105 are-not limited in shape (mesh pattern), and the shape of the openings 105 may be a triangle such an equilateral triangle, a square such as a regular square, rectangular, rhombus or trapezoid, a polygon such as a hexagon, a circle, an oval, or the like. The mesh part 103 is a combination of a plurality of these openings 105. From the viewpoint of the opening rate and the non-recognizability of the mesh, the line width W is 50 μm or less, preferably 20 μm or less, and from the viewpoint of light transmittance, the line distance P (line pitch) is 125 μm or more, preferably 200 μm or more. The opening rate is preferably 50% or more. In order to avoid the occurrence of moiré fringes or the like, the bias angle (the angle between the line parts of the mesh and the sides of the electromagnetic wave shielding sheet) may be properly selected with consideration for the pixel and emission properties of a display.

(Second Blackening Layer)

Although the same material and method as those used to form the first blackening layer 25A may be used to form the second blackening layer 25B, black chromium, black nickel, nickel alloys, and the like may also be used. The nickel alloys useful herein include nickel-zinc alloys, nickel-tin alloys, and nickel-tin-copper alloys. In particular, nickel alloys are excellent in electrical conductivity and blackness. Further, the second blackening layer 25B may be made to have, in addition to the blackening effect, the function of preventing the metal layer 21 from corrosion Generally, the particles with which the second blackening layer 25B is formed are needle like, so that they are readily deformed by external forces and undergo change in appearance. Nickel alloy particles are, however, not so easily deformed, and since the subsequent steps are effected with the second blackening layer 28B face exposed, the use of a nickel alloy is more preferred. A conventional electroplating or electroless plating process may be used to deposit a nickel alloy. The deposition of a nickel alloy may be effected after conducting nickel plating.

(Blackening Treatment)

By conducting blackening treatment in the above-described manner, it is possible to blacken the front faces (surfaces) of the line parts (the surfaces of the protrusions) and even the side faces of the line parts (the side faces of the protrusions) of the metal mesh layer 21. Thus, the patterned metal mesh layer 21 is fully covered with the first blackening layer 25A and the second blackening layer 25B. Therefore, the metal mesh part (line parts) for shielding electromagnetic waves can shield electromagnetic waves generated by a PDP, and does not reflect both extraneous light from fluorescent lamps or the like and display light from the PDP. It is thus possible to view, on the PDP, a high-contrast image in a good state.

In this Specification, roughening and blackening are collectively referred to as blackening treatment. The preferred reflection Y value of the blackening layer is approximately 15 or less, preferably 5 or less, more preferably 2.0 or less. Reflection Y value measurements were made by the use of a spectrophotometer UV-3100PC (manufactured by Shimadzu Corp., Japan), at an angle of incidence of 50° (wavelength: from 380 to 780 nm).

The electromagnetic wave shielding sheets of the present invention, combined with other optical members, can be used as front panels for PDPs. For example, a combination of the electromagnetic wave shielding sheet and an optical member having the function of absorbing near infrared rays can absorb near infrared rays emitted from a PDP, so that it can prevent malfunction of remote-control apparatus, optical communication apparatus, and the like that are being used near the PDP. Further, a combination of the electromagnetic wave shielding sheet and an optical member having the function of preventing reflection and/or glaring of light does not reflect both display light from a PDP and extraneous light externally incident on the PDP, so that it can improve image visibility.

In the case where the frame 101 is provided, this part is also blackened simultaneously with the mesh part 103 and thus becomes blacker, so that a display on which such an electromagnetic wave shielding sheet is mounted seems high class.

Moreover, of the electromagnetic wave shielding sheets of the present invention, one having blackening layers on both sides has an electromagnetic wave shielding layer whose both surfaces are black in color, so that such an electromagnetic wave shielding sheet can be mounted on a PDP with either side facing to the PDR Furthermore, if a flexible material is used for the transparent substrate 11, it is possible to process, in every step, a belt-shaped, continuously rolled-up (wound-up) transparent substrate, while continuously or intermittently unrolling and carrying it. There can thus be produced an electromagnetic wave shielding sheet in a decreased number of steps, two or more steps being collectively effected in one step, with high productivity.

Modified Embodiments

The present invention encompasses the following modifications.

(1) Although a method of lamination using an adhesive has been employed to laminate the transparent substrate 11 and the [anticorrosive layer 23A/first blackening layer 25A/metal layer 21] to form the laminate 1a, it is not necessary to use the adhesive. For example, after making the surface of the transparent substrate 11 electrically conductive, the first blackening layer 25A and the metal layer 21 may be formed on this surface by a conventional electroless plating or electroplating process.

Figure 3:
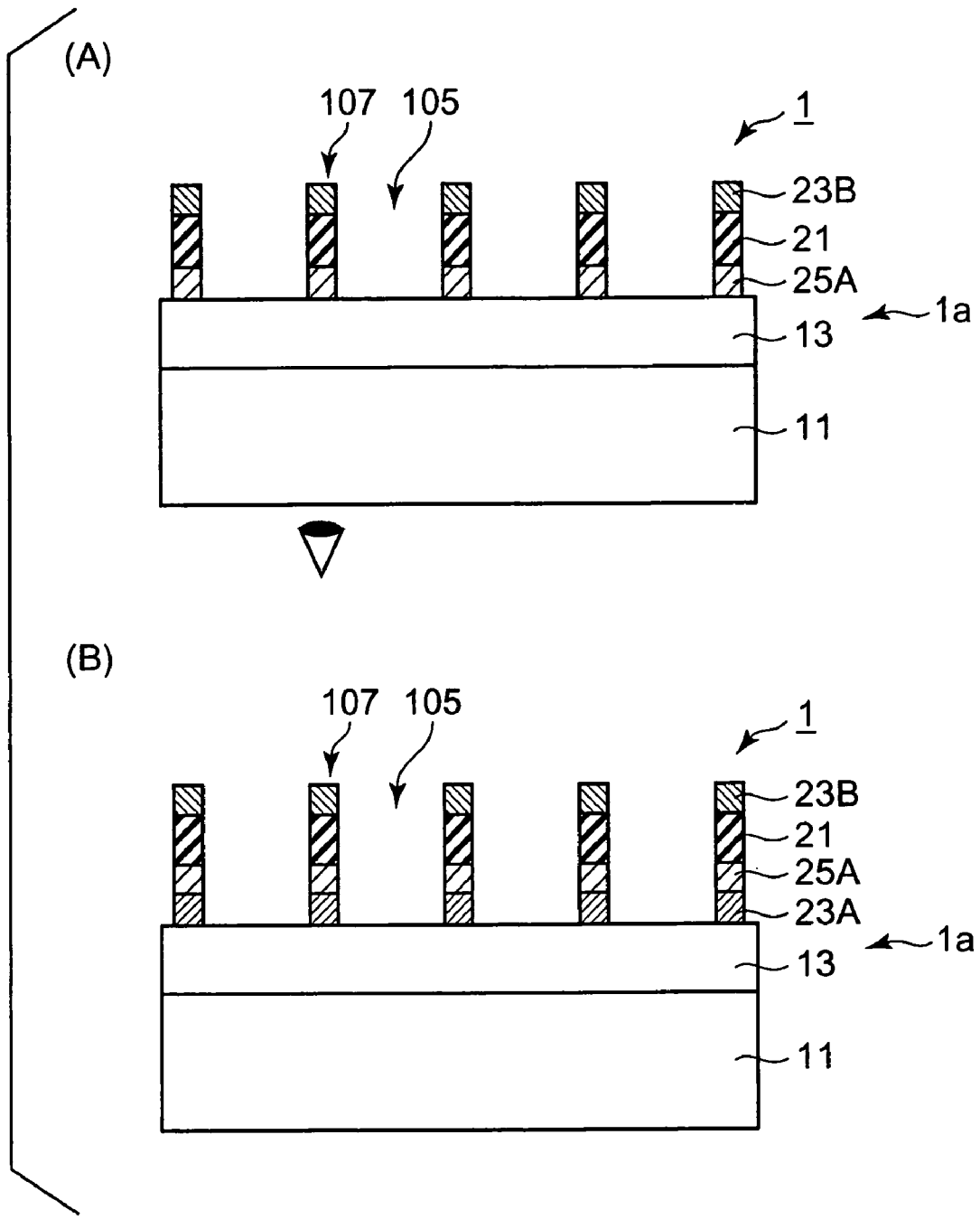
FIG. 3 is a sectional view of a mesh part of an electromagnetic wave shielding sheet according to the present invention.
Figure 4:
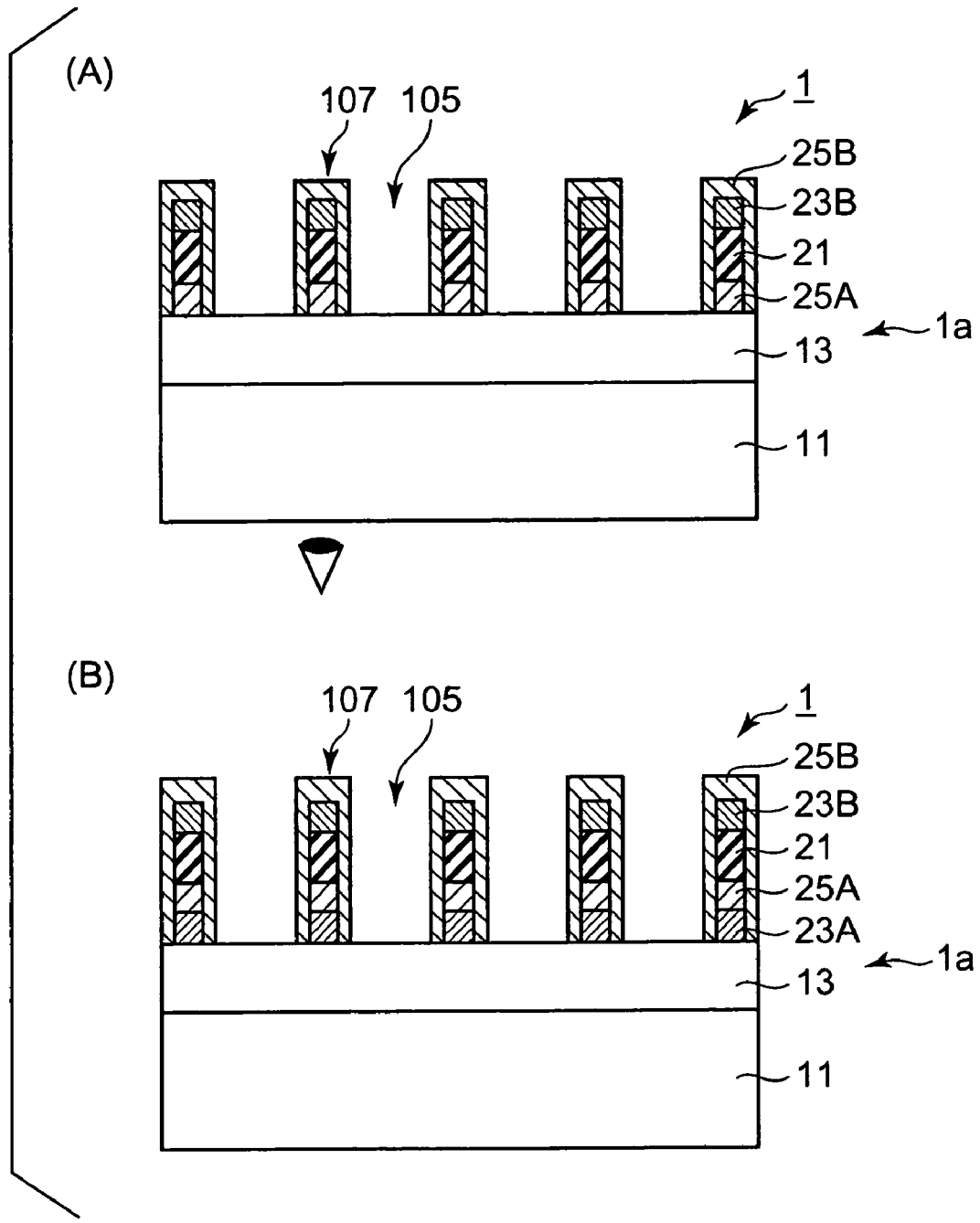
FIG. 4 is a sectional view of a mesh part of an electromagnetic wave shielding sheet according to the present invention.

(2) After obtaining such an electromagnetic wave shielding sheet 1 as is shown in FIG. 3 or 4, the surface of the mesh part 103 that is rough (due to the irregularities brought about by the line parts 107 and the openings 105) may be smoothened by filling the openings 105 with a transparent resin. By doing so, air bubbles never remain in the openings 105 when the mesh part of the electromagnetic wave shielding sheet and another member (a transparent substrate, a near infrared ray absorbing filter, an antireflection filter, or the like) are laminated with an adhesive layer in the later step. It is thus possible to avoid lowering of the sharpness of an image displayed that occurs when air bubbles remaining in the openings scatter light.

EXAMPLES

The present invention will now be explained more specifically by way of Examples and Comparative Example. However, the present invention is not limited to the following Examples.

Example 1

Electrolytic copper foil with a thickness of 10 μm was used as the metal layer 21. Copper-cobalt alloy particles (mean particle diameter: 0.3 μm) were cathodically electrodeposited on one surface of the metal layer 21, thereby conducting blackening treatment to form a first blackening layer 25A.

Subsequently, the other surface, on the side opposite to the first blackening layer 25A side, of the metal layer 21 was subjected to zinc plating and to chromate treatment, whereby a second anticorrosive layer 23 containing zinc and chromium was formed on this surface of the metal layer 21.

The combination of the metal layer 21, the second anticorrosive layer 23B, and the first blackening layer 25A was laminated to a transparent substrate 11 made of a biaxially oriented 100-μm thick PET film A4300 (trademark of a polyethylene terephthalate film, manufactured by Toyobo Co., Ltd., Japan) with an adhesive layer 13 of a two-part curing urethane adhesive, and this laminate was aged at 50° C. for 3 days to form a laminate 1*a*. For the adhesive were used a main agent Takelack A-310 (trademark, manufactured by Takeda Chemical Industries, Ltd., Japan) consisting of polyester urethane polyol, and a curing agent A-10 (trademark, manufactured by Takeda Chemical Industries, Ltd., Japan) consisting of hexamethylene diisocyanate. The adhesive was applied in such an amount that the dried adhesive layer had a thickness of 7 μm.

The [first blackening layer 25A/metal layer 21/second anticorrosive layer 23B] in the laminate 1*a* was photolithographically made into a mesh pattern.

Using the existing production line for shadow masks for color Tvs, the laminate in the form of a belt-shaped (rolled-up) continuous web was subjected to a series of the steps of from masking to etching. First, a casein photosensitive resist was applied to the entire surface of the laminate 1*a* by dipping. This laminate was intermittently carried to the next station, where contact exposure to ultraviolet light from a mercury vapor lamp was conducted by the use of a negative pattern plate for forming a mesh part 103 having line parts with a line width W of 22 μm, a line distance P (pitch) of 300 μm, and a bias angle of 49 degrees, the line parts defining regular-square openings 105, and a 15-mm wide frame 101 surrounding the mesh part 103. The laminate was then transferred from one station to another for development with water, for film-hardening treatment, and for baking by heating. The baked laminate was further carried to the next station, where etching was conducted by spraying an aqueous ferric chloride solution, as an etchant, over the laminate to make openings 105 in the laminate. While transferring from one station to another, the laminate was washed with water, and, with an alkaline solution, the resist was stripped and the zinc contained in the second anticorrosive layer 23B was eluted, thereby obtaining a second anticorrosive layer 23B containing chromium. This one was washed with water and was then dried by heating to form a mesh.

Example 2

An electromagnetic wave shielding sheet was obtained in the same manner as in Example 1, except that, in the anticorrosive-layer-forming step, both sides of the metal layer 21 were subjected to anticorrosive treatment to form a [first anticorrosive layer 23A/first blackening layer 25A/metal layer 21/second anticorrosive layer 23B].

Example 3

The mesh part 103 of the electromagnetic wave shielding sheet of Example 1 was further subjected to second blackening treatment. By using, as a plating bath, a mixture of an aqueous nickel ammonium sulfate solution (60 g/1 liter), an aqueous zinc sulfate solution (7.5 g/1 liter) and an aqueous sodium thiosulfate solution (15 g/1 liter), the treatment was carried out for 2 minutes under the conditions that the bath temperature and the current density were 35° C. and 20 A/cm$^2$, respectively, to form a second blackening layer 25B. Thus, there was obtained an electromagnetic wave shielding sheet 1 in which the front face (surface), the back face, and the side faces of the mesh part 103 were fully blackened.

Example 4

An electromagnetic wave shielding sheet 1 in which the front face, the back face, and the side faces of its mesh part 103 were fully blackened was obtained in the same manner as in Example 3, except that the electromagnetic wave shielding sheet of Example 2 was used.

Example 5

An electromagnetic wave shielding sheet 1 was obtained in the same manner as in Example 1, except that, in the anticorrosive-layer-forming step, both sides of the metal layer 21 were subjected to tin-nickel alloy plating and also to chromate treatment to form a [first anticorrosive layer 23A/first blackening layer 25A/metal layer 21/second anticorrosive layer 23B]. By eluting tin from the second anticorrosive layer 23B while stripping the resist, this layer was made to contain nickel and chromium.

Example 6

An electromagnetic wave shielding sheet 1 was obtained in the same manner as in Example 2, except that, in the anticorrosive-layer-forming step, both sides of the metal layer 21 were subjected to nickel-zinc alloy plating, to chromate treatment, and to silane-coupling agent treatment to form a [first anticorrosive layer 23A/first blackening layer 25A/metal layer 21/second anticorrosive layer 23B]. By eluting zinc from the second anticorrosive layer 23 while stripping the resist, this layer was made to contain nickel, chromium, and silicon.

Comparative Example 1

An electromagnetic wave shielding sheet was obtained in the same manner as in Example 1, except that the anticorrosive layer was not formed on the metal layer 21, and that a cadmium-deposited black layer was used as the first blackening layer to form a [first blackening layer 25A/metal layer 21].

(Evaluation)

Evaluation was carried out in terms of corrosion resistance, non-recognizability, and adhesion.

Corrosion resistance was evaluated by visually observing each electromagnetic wave shielding sheet that had been subjected to high-temperature, high-moisture testing at 60° C. and 95% RH for 1000 hours. The electromagnetic wave shielding sheet whose surface had undergone no change in color was rated as acceptable and was denoted by the mark "◯"; while the electromagnetic wave shielding sheet whose surface had undergone significant change in color was rated as unacceptable and was denoted by the mark "x".

Non-recognizability was evaluated by visually observing the mesh part of each electromagnetic wave shielding sheet to which light was applied. The electromagnetic wave shielding sheet whose mesh part was unrecognizable was rated as acceptable and was denoted by the mark "◎"; the electromagnetic wave shielding sheet whose mesh part underwent color change but seemed practically non-problematic was also rated as acceptable and was denoted by the mark "◯"; and the electromagnetic wave shielding sheet whose mesh part was obviously recognizable was rated as unacceptable and was denoted by the mark "x".

The adhesion of the blackening layer was evaluated by rubbing the blackened surface with a nonwoven fabric impregnated with water and observing whether the blackening layer was transferred to the nonwoven fabric or not. The electromagnetic wave shielding sheet whose blackening layer was transferred to the nonwoven fabric to blacken the fabric was rated as unacceptable and was denoted by the mark "x"; the electromagnetic wave shielding sheet whose blackening layer had been discolored only unnoticeably was rated as acceptable and was denoted by the mark "○"; and the electromagnetic wave shielding sheet whose blackening layer had been discolored but seemed practically non-problematic was also rated as acceptable and was denoted by the mark "Δ".

(Results of Evaluation)

The results of evaluation are shown in Table 1.

TABLE 1

| Items | | Example | | | | | | Comparative Example |
|---|---|---|---|---|---|---|---|---|
| | | 1 | 2 | 3 | 4 | 5 | 6 | 1 |
| First anticorrosive layer | | absent | present | absent | present | absent | present | absent |
| Second anticorrosive layer | | present | present | present | present | present | present | absent |
| Second anticorrosive layer | Presence/absence | present | Present | present | present | present | present | absent |
| | Remaining material | Cr | Cr | Cr | Cr | CrNi | CrNiSi | — |
| Second blackening layer | Presence/absence | absent | absent | present | present | absent | absent | — |
| | Material | — | — | Ni alloy | Ni alloy | — | — | — |
| | Condition | — | — | 2 min | 2 min | — | — | — |
| Rating | Corrosion resistance | ○ | ○ | ○ | ○ | ○ | ○ | X |
| | Non-recognizably of mesh | ○ | ○ | ◎ | ◎ | ○ | ○ | X |
| | Adhesion of blacking layer | ○ | ○ | ○ | ○ | ○ | ○ | Δ |

The electromagnetic wave shielding sheets of Examples 1 to 6 were rated as acceptable in terms of every evaluation item. The electromagnetic wave shielding sheet of Comparative Example 1 was rated as acceptable in terms of the adhesion of the blackening layer, but was rated as unacceptable in terms of corrosion resistance. Moreover, the blackening layer partly peeled off in the intermediate step; since such portions reflected light, the mesh part partly appeared glistening, which made this electromagnetic wave shielding sheet unacceptable.

Further, the electromagnetic wave shielding effect was determined by the KEC method (a method of measuring electromagnetic waves developed by Kansai Electronic Industry Development Center, Japan). All of the electromagnetic wave shielding sheets of Examples 1 to 6 and Comparative Example 1 attenuated, at rates of 30 to 60 dB, electromagnetic waves having frequencies of 30 MHz to 1000 MHz and were thus confirmed to have satisfactorily excellent electromagnetic wave shielding properties.

The invention claimed is:

1. An electromagnetic wave shielding sheet comprising:
   a transparent substrate,
   a metal mesh layer laminated to one surface of the transparent substrate with an adhesive layer,
   a first blackening layer containing copper being formed on one face of the metal mesh layer on a side of the transparent substrate, and a second anticorrosive layer containing one or more metals selected from chromium, nickel, and silicon being formed on a other face of the metal mesh layer on a side opposite to the transparent substrate, and
   a second blackening layer fully covering side faces of the first blackening layer, the metal layer, and the second anticorrosive layer that are on the transparent substrate, and a front face of the second anticorrosive layer.

2. The electromagnetic wave shielding sheet according to claim 1, further comprising,
   a first anticorrosive layer containing one or more metals selected from chromium, nickel, and silicon being formed between the first blackening layer and the transparent substrate.

3. The electromagnetic wave shielding sheet according to claim 2, wherein
   side faces of the first anticorrosive layer, and the side faces of the first blackening layer, the metal layer, and the second anticorrosive layer that are on the transparent substrate, and the front face of the second anticorrosive layer are fully covered with the second blackening layer.

4. The electromagnetic wave shielding sheet according to claim 3, wherein
   the second blackening layer is formed by plating, and comprises at least one metal selected from copper, cobalt, nickel, zinc, molybdenum, tin, and chromium, or a compound of any of these metals, or an alloy consisting of two or more of these metals.

5. The electromagnetic wave shielding sheet according to claim 1, wherein
   the second blackening layer is formed by plating, and comprises at least one metal selected from copper, cobalt, nickel, zinc, molybdenum, tin, and chromium, or a compound of any of these metals, or an alloy consisting of two or more of these metals.

6. A method for producing an electromagnetic wave shielding sheet, comprising the steps of:
   preparing a metal layer, successively forming a first blackening layer and a first anticorrosive layer on a face of the metal layer on a side of a transparent substrate,
   forming a second anticorrosive layer on a other face of the metal layer on a side opposite to the transparent substrate,
   laminating the metal layer and the transparent substrate with an adhesive layer, with the first anticorrosive layer facing the transparent substrate, to form a laminate, and etching the laminate to make the metal layer into a mesh,and after the step of etching, fully covering side faces of the first anticorrosive layer, the first blackening layer, the metal layer, and the second anticorrosive layer that are in the laminate, and a front face of the second anticorrosive layer with a second blackening layer.

7. The method for producing an electromagnetic wave shielding sheet according to claim 6, wherein at least either of the first anticorrosive layer and the second anticorrosive layer contains one or more metals selected from nickel, chromium, and silicon, and also zinc and/or tin when it is initially formed, and the zinc and/or tin is removed from the first anticorrosive layer and/or the second anticorrosive layer in the step of etching.

* * * * *